United States Patent [19]

Wilhelm et al.

[11] Patent Number: 5,473,272

[45] Date of Patent: Dec. 5, 1995

[54] DIGITAL DIFFERENTIAL AMPLIFIER SWITCHING STAGE WITH CURRENT SWITCH

[75] Inventors: Wilhelm Wilhelm, München; Josef Hoelzle, Bad Woerishofen, both of Germany

[73] Assignee: Siemens Aktiengesellschaft, Munich, Germany

[21] Appl. No.: 267,822

[22] Filed: Jun. 28, 1994

[30] Foreign Application Priority Data

Jun. 28, 1993 [DE] Germany .......... 43 21 482.7

[51] Int. Cl.$^6$ ............................................. H03K 19/20
[52] U.S. Cl. ............................................ 326/126; 326/124
[58] Field of Search ................................ 326/124, 126, 326/128

[56] References Cited

U.S. PATENT DOCUMENTS

| | | | |
|---|---|---|---|
| 4,347,446 | 8/1982 | Price | 307/443 |
| 5,122,683 | 6/1992 | Sugoh | 326/126 |
| 5,177,379 | 6/1993 | matsumoto | 326/126 |
| 5,187,391 | 2/1993 | Xamese | 326/126 |
| 5,214,318 | 5/1993 | Nakanishi et al. | 307/303 |
| 5,237,216 | 8/1993 | Hayano | 326/126 |
| 5,293,083 | 3/1994 | Askin | 326/126 |
| 5,381,057 | 1/1995 | Kuroda | 326/126 |

FOREIGN PATENT DOCUMENTS

| | | |
|---|---|---|
| 0055093 | 6/1982 | European Pat. Off. . |
| 0410479 | 1/1991 | European Pat. Off. . |
| 0440192 | 8/1991 | European Pat. Off. . |
| 4100278 | 7/1991 | Germany . |
| WO85/04774 | 10/1985 | WIPO . |

OTHER PUBLICATIONS

Japanese Patent Abstract No. 60–198921 (Mitani), dated Oct. 8, 1985.
Patents Abstracts Of Japan, E–1113, Sep. 18, 1991 vol. 15. No. 371 & JP3–147421 (NEC) Jun. 24, 1991.
patents Abstracts Of Japan, E–1193, Apr. 22, 1992, vol. 16, no. 166 & JP4–14313 (FUJITSU) Jan. 20, 1992.
proceedings Of The IEEE, volume 78, No. 11, Nov. 1990 (Wilson) "Advances in Bipolar VLSI".

Primary Examiner—Edward P. Westin
Assistant Examiner—Andrew Sanders
Attorney, Agent, or Firm—Herbert L. Lerner; Laurence A. Greenberg

[57] ABSTRACT

A digital switching stage includes a differential amplifier having a first and a second differential amplifier branch. A first resistor is connected in the first differential amplifier branch and has a first terminal and a second terminal. The first terminal is a terminal for a first supply potential. A first bipolar transistor is connected in an emitter follower circuit with respect to the second terminal of the first resistor and has an emitter being connected to an output terminal. A second bipolar transistor has a base and has a collector-to-emitter path being connected between the output terminal and a terminal for a second supply potential. A second resistor is connected in the second differential amplifier branch and has a first terminal and a second terminal. The first terminal of the second resistor is connected to the output terminal and the second terminal of the second resistor is connected to the base of the second bipolar transistor.

5 Claims, 2 Drawing Sheets

DIGITAL DIFFERENTIAL AMPLIFIER SWITCHING STAGE WITH CURRENT SWITCH

BACKGROUND OF THE INVENTION

1. Field of the Invention

The invention relates to a digital switching stage having a differential amplifier with a first and a second differential amplifier branch; a first resistor which is connected in the first differential amplifier branch has a first terminal that is a terminal for a first supply potential and has a second terminal; and a first bipolar transistor which is connected in an emitter follower circuit with respect to the second terminal of the first resistor has an emitter which is connected to an output terminal.

Such a switching stage is shown in the literature, such as in an article by George R. Watson, entitled "Advances in Bipolar VLSI", in Proceedings of the IEEE, Vol. 78, No. 11, pp. 1706–1719, November 1990. An output of the switching stage is essentially capacitively loaded by a connecting line connected to it. At a positively oriented edge of the output signal, the current required to reverse the charge of the parasitic capacitance which is operative on the output side flows through the emitter follower transistor. That is, the charge reversing current is furnished at low impedance by the first supply potential source. At a negatively oriented output signal edge, the charge reversing current flows either through one additional current source or through the input of a further switching stage connected to the output side. The current is furnished at high impedance from a further supply potential source.

In order to achieve a high operating speed, the switching stages must have adequate driver capability and a high permanent current therefore flows through the additional current source or the following switching stage. The power loss is correspondingly high.

2. Summary of the Invention

It is accordingly an object of the invention to provide a digital switching stage with a current switch, which overcomes the hereinafore-mentioned disadvantages of the hereto-fore-known devices of this general type and which has a high processing speed and a low power loss.

With the foregoing and other objects in view there is provided, in accordance with the invention, a digital switching stage, comprising a differential amplifier having a first and a second differential amplifier branch; a terminal for a first supply potential, a terminal for a second supply potential, and an output terminal; a first resistor being connected in the first differential amplifier branch and having a first terminal and a second terminal, the first terminal being the terminal for the first supply potential; a first bipolar transistor being connected in an emitter follower circuit with respect to the second terminal of the first resistor and having an emitter being connected to the output terminal; a second bipolar transistor having a base and having a collector-to-emitter path being connected between the output terminal and the terminal for the second supply potential; and a second resistor being connected in the second differential amplifier branch and having a first terminal and a second terminal, the first terminal of the second resistor being connected to the output terminal, and the second terminal of the second resistor being connected to the base of the second bipolar transistor.

In the switching stage according to the invention, for both the leading and the trailing output signal edges, the charge reversing current of the parasitic capacitance that is operative on the output side is furnished at low impedance from the supply potential forces. The input and output signal levels are symmetrical to the supply potentials. In comparison with the conventional switching stage, the supply voltage is lower, so that the lower loss is further reduced thereby.

In accordance with another feature of the invention, there is provided a current source transistor having a collector-to-emitter path, the differential amplifier including a first and at least one second switching transistor having mutually coupled emitters being connected through the collector-to-emitter path of the current source transistor to the terminal for the second supply potential.

In accordance with a further feature of the invention, there is provided a voltage divider connected between the terminals for the supply potentials for supplying the base of the first switching transistor with a reference potential.

In accordance with an added feature of the invention, the voltage divider includes a first diode having an anode connected to the terminal for the first supply potential and having a cathode; a second diode having a cathode connected to the terminal for the second supply potential and having an anode; a first resistor connected between the cathode of the first diode and the base of the first switching transistor; and a second resistor connected between the base of the first switching transistor and the anode of the second diode.

In accordance with an additional feature of the invention, the base of the current source transistor is connected to the anode of the second diode.

In accordance with yet another feature of the invention, the first and second resistors of the voltage divider have the same given resistance.

In accordance with yet a further feature of the invention, the first and second resistors of the differential amplifier each have the same resistance being twice the given resistance.

In accordance with a concomitant feature of the invention, the resistance of the first resistor of the differential amplifier is greater than the resistance of the second resistor of the differential amplifier, and the resistances of the first and second resistors of the differential amplifier are each greater than twice the given resistance.

Other features which are considered as characteristic for the invention are set forth in the appended claims.

Although the invention is illustrated and described herein as embodied in a digital switching stage with a current switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
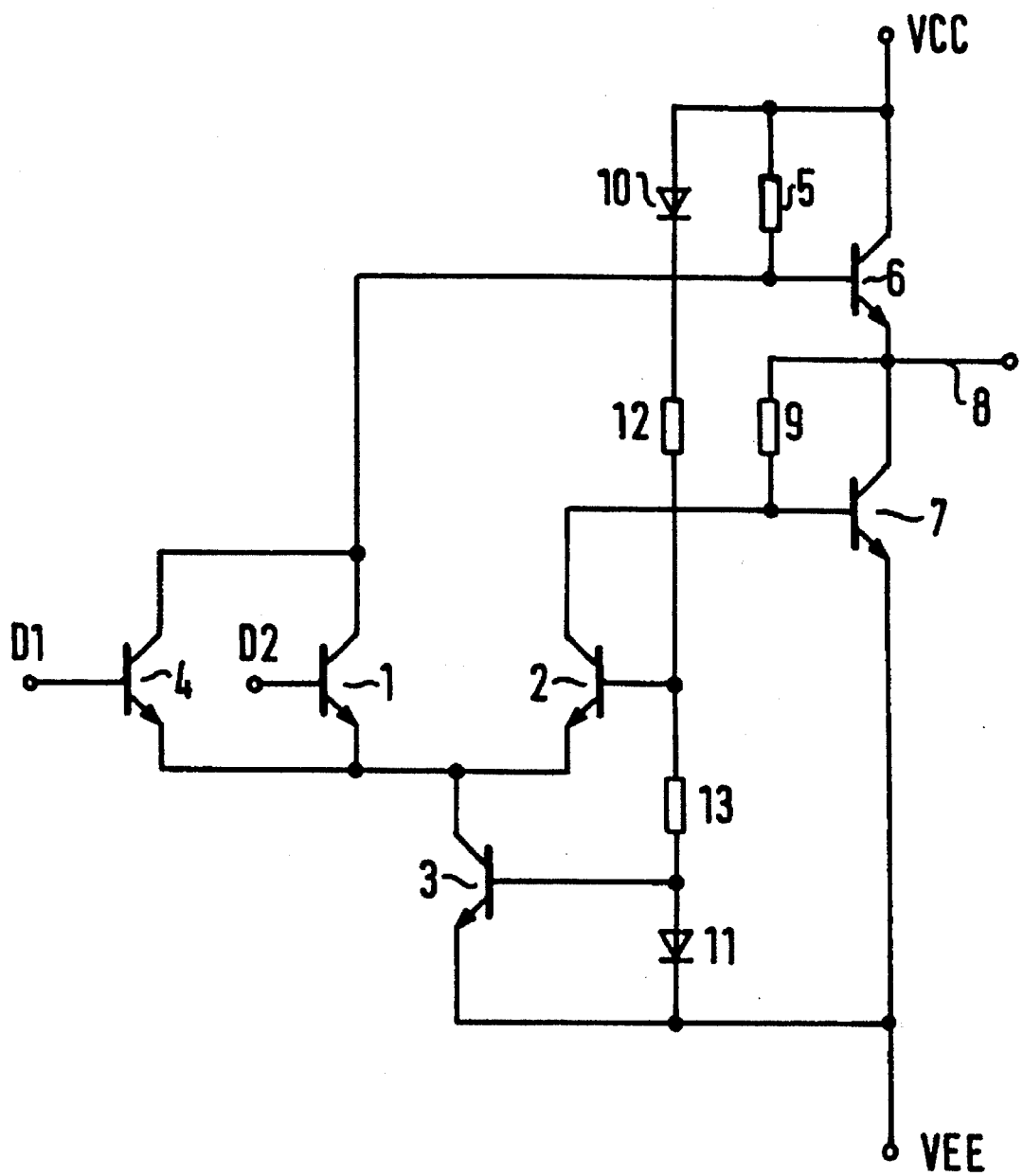
FIG. 1 is a schematic circuit diagram of an OR switching stage according to the invention.

Referring now to the figures of the drawing in detail and first, particularly, to FIG. 1 thereof, there is seen a switching stage which includes a differential amplifier with switching transistors 1, 2, 4 having emitters that are coupled together and are connected to a terminal for a supply potential VEE through a collector-to-emitter path of a current source transistor 3. The switching transistors 1 and 2 may be referred to as first and second transistors. The transistors 1, 4 are connected in parallel in terms of the their collector-to-emitter paths, so that an OR linkage is formed between input signals D1, D2 applied to base terminals thereof. One respective load resistor 5 and 9 is located in each of the differential amplifier branches. A first terminal of the first load resistor 5 is connected to a terminal for a first supply potential VCC, which has a positive polarity relative to the second supply potential VEE. The second terminal of the resistor 5 is connected through a base-to-emitter path of an emitter follower transistor 6 to an output terminal 8. A collector of the transistor 6 is connected to the terminal for the supply potential VCC. The output terminal 8 is connected through a collector-to-emitter path of a further transistor 7 to the supply potential VEE. The second resistor 9 has first and second terminals being respectively connected between a collector and a base of the transistor 7.

The transistors 6, 7 function as a totem pole circuit between the supply potentials VCC, VEE. The resistors 5, 9 prevent the respectively associated transistors 6 and 7 from attaining saturation. If the switching current of the current source transistor 3 is flowing through one of the resistors 5, 9, then the base potential of the corresponding transistor 6 or 7 is lowered far enough that the transistor is blocked. Only the base current of the applicable transistor then flows through the other respective one of the resistors 5, 9, and therefore the collector-to-emitter path of that transistor functions essentially as a diode. The H (high) level is thus lower, by the voltage of a diode path, than the positive supply potential VCC, and the low (L) level is higher, by the voltage of a diode path, than the negative supply potential VEE. Accordingly, the signal levels are symmetrical with respect to the supply potentials VCC, VEE and with respect to the center of the potential difference between the potentials VCC, VEE.

For a switchover from L to H, the charge reversing current for a capacitor applied to the output terminal 8 is furnished at the output terminal 8 from the supply potential source VCC through the collector-to-emitter path of the transistor 6. For a switchover from H to L, the charge current for a capacitor applied to the output terminal 8 is furnished at the output terminal 8 from the supply potential source VEE through the collector-to-emitter path of the transistor 7. These current paths are of low impedance in each case.

A reference potential is applied to the base of the switching transistor 2. Suitably, the reference potential is produced by voltage division from the supply potentials VCC, VEE. It is especially advantageous to provide a current path connected between the supply potential terminals, which includes a first diode 10, first and second resistors 12, 13 having the same resistance, and a second diode 11. The diodes 10, 11 are connected in the flow direction. The diode 10 is connected to the positive supply potential and the diode 11 is connected to the negative supply potential. The reference voltage generator may be used jointly for a plurality of current switches, for instance four of them. A base of the current source transistor 3 is then connected to the anode terminal of the diode 11. The reference current path and the collector-to-emitter path of the current source transistor 3 thus form a current mirror.

The following dimensions can be advantageous for dimensioning the resistors 5, 9 and 12, 13. The resistors 12, 13 have the same resistance R, as already indicated. In a first case, the resistors 5, 9 are each of the same size and are each dimensioned with twice the resistance, or 2.R. In the state of repose, a current on the order of magnitude of the switching current through the current source transistor 3 or through the reference current path then flows through the totem pole stage formed by the transistors 6, 7. In a second case, the resistor 5 is dimensioned to be slightly larger than the resistor 9. In that case the current through the totem pole stage having the resistors 6, 7 becomes less. It has been demonstrated that dimensioning the resistor 5 with a resistance of 2.4.R and the resistor 9 with a resistance of 2.2. R is especially advantageous, because in that case in the state of repose one of the transistors 6, 7 is blocked, so that virtually no transverse current then flows. The supply voltage suitably amounts to approximately 2 V, so that none of the transistors is driven in saturation. Since the signal levels are symmetrical with the supply potentials, both the supply potential VEE and the supply potential VCC may be chosen as the reference potential (ground).

Figure 2:
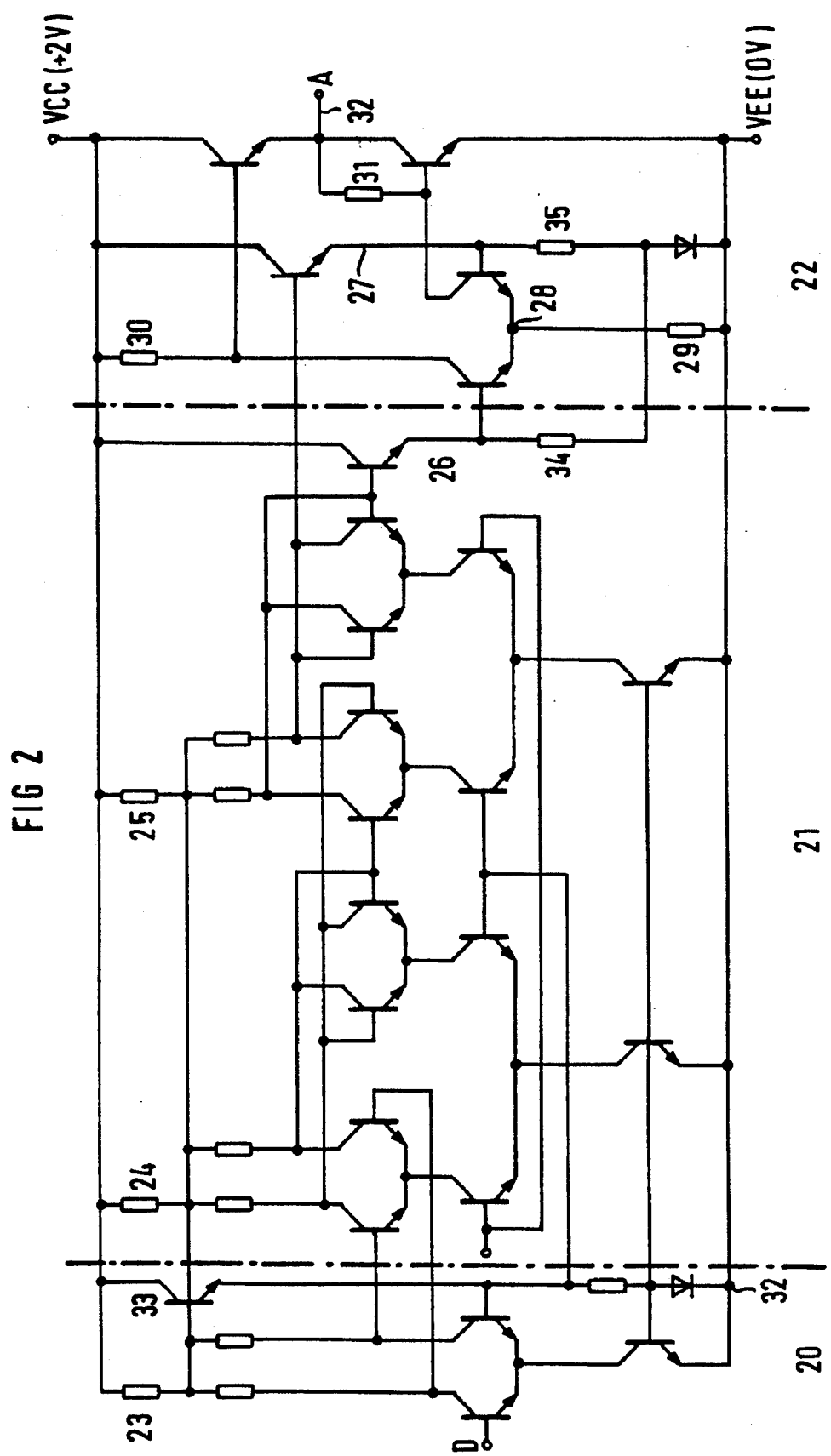
FIG. 2 is a circuit diagram of a master-slave flip-flop with the switching stage according to the invention.

In FIG. 2, the switching stage according to the invention is constructed as an output stage of a master-slave flip-flop. The signal D to be stored in memory is delivered to an input stage 20, which is followed by a master-slave stage 21 controlled by a clock signal CLK. An output signal of the master-slave stage 21 is amplified by a switching stage 22 and converted to the corresponding output logic level. The master-slave stage 21 furnishes differential signals at outputs 26, 27 thereof. A circuit node 28 therefore always remains at the same potential, regardless of the circuit state. The current source that furnishes the switching current for the differential amplifier can thus be constructed either as a current source transistor or as a resistor 29, as shown. A ratio of resistances of load resistors 30, 31 to that of the current source resistor 29 is set in such a way that for an output signal A at an output 32, the output signal levels described in conjunction with FIG. 1 result.

By evaluating the differential outputs 26, 27 of the master-slave stage 21 in the output stage 22, the stages 20, 21 can be driven with reduced, and suitably halved, signal levels. To that end, the switching stages of the input stage 20 and the master-slave stage 21 are applied to the supply potential VCC through resistors 23, 24, 25. In a reference current branch 32, the input stage 20 is also provided with a bipolar transistor 33, which is connected as an emitter follower, with respect to the resistor 23, in the reference current branch 32. Suitably, all of the resistors of the stages 20, 21 and resistors 34, 35, by way of which the outputs 26, 27 of the master-slave stage 21 are supplied with current, are of equal size.

We claim:

1. A digital switching stage, comprising:

a differential amplifier having a first and a second differential amplifier branch;

a terminal for a first supply potential, a terminal for a second supply potential, and an output terminal;

a first resistor being connected in said first differential amplifier branch and having a first terminal and a second terminal, said first terminal being said terminal for the first supply potential;

a first bipolar transistor being connected in an emitter follower circuit with respect to said second terminal of said first resistor and having an emitter being connected to said output terminal;

a second bipolar transistor having a base and having a collector-to-emitter path being connected between said output terminal and said terminal for said second supply potential;

a second resistor being connected in said second differential amplifier branch and having a first terminal and a second terminal, said first terminal of said second resistor being connected to said output terminal, and said second terminal of said second resistor being connected to the base of said second bipolar transistor;

a current source transistor having a collector-to-emitter path, said differential amplifier including a first and at least one second switching transistor having mutually coupled emitters being connected through the collector-to-emitter path of said current source transistor to said terminal for the second supply potential;

a voltage divider connected between said terminals for said supply potentials for supplying the base of said first switching transistor with a reference potential, said voltage divider including:

a first diode having an anode connected to said terminal for the first supply potential and having a cathode;

a second diode having a cathode connected to said terminal for the second supply potential and having an anode;

a first resistor connected between the cathode of said first diode and the base of said first switching transistor; and a second resistor connected between the base of said first switching transistor and the anode of said second diode.

2. The digital current stage according to claim 1, wherein the base of said current source transistor is connected to the anode of said second diode.

3. The digital current stage according to claim 2, wherein said first and second resistors of said voltage divider have the same given resistance.

4. The digital current stage according to claim 3, wherein said first and second resistors of said differential amplifier each have the same resistance being twice the given resistance.

5. The digital current stage according to claim 3, wherein the resistance of said first resistor of said differential amplifier is greater than the resistance of said second resistor of said differential amplifier, and the resistances of said first and second resistors of said differential amplifier are each greater than twice the given resistance.

\* \* \* \* \*